DIODE HEAT SINK STRUCTURE

Filed Oct. 12, 1961 2 Sheets-Sheet 1

INVENTORS.
Michael A. Koltuniak
Thomas N. Urquhart,
BY Edward J. Sopcak.
Harness, Dickey & Pierce
ATTORNEYS.

Feb. 23, 1965 M. A. KOLTUNIAK ETAL 3,171,069
DIODE HEAT SINK STRUCTURE
Filed Oct. 12, 1961 2 Sheets-Sheet 2
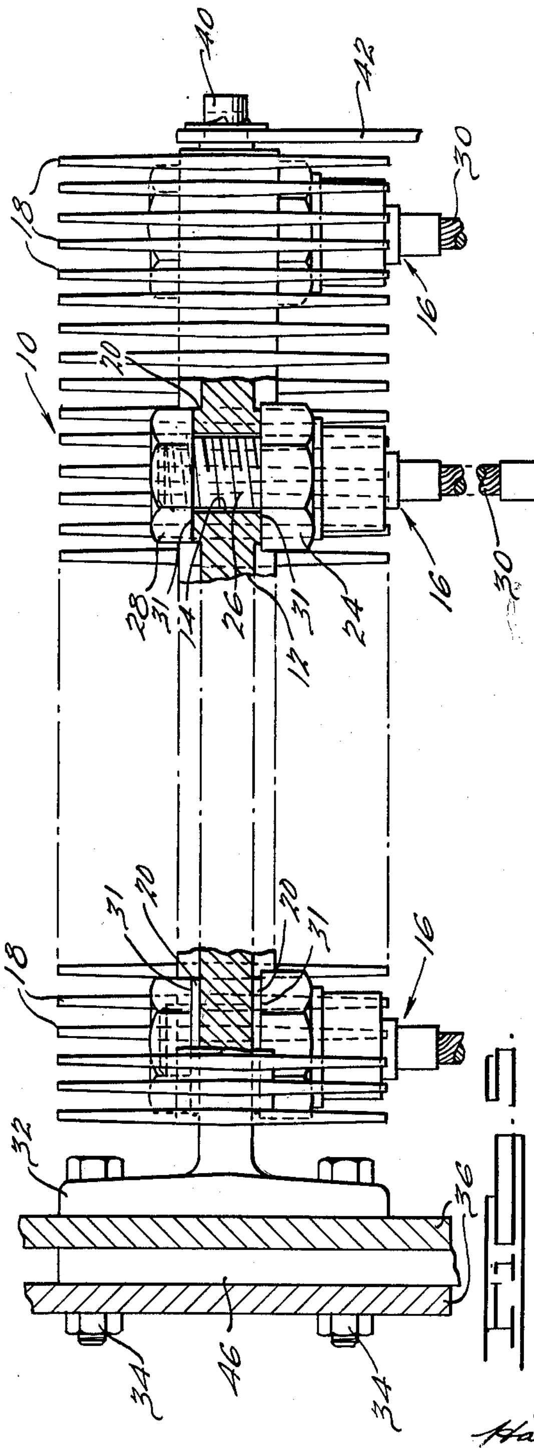
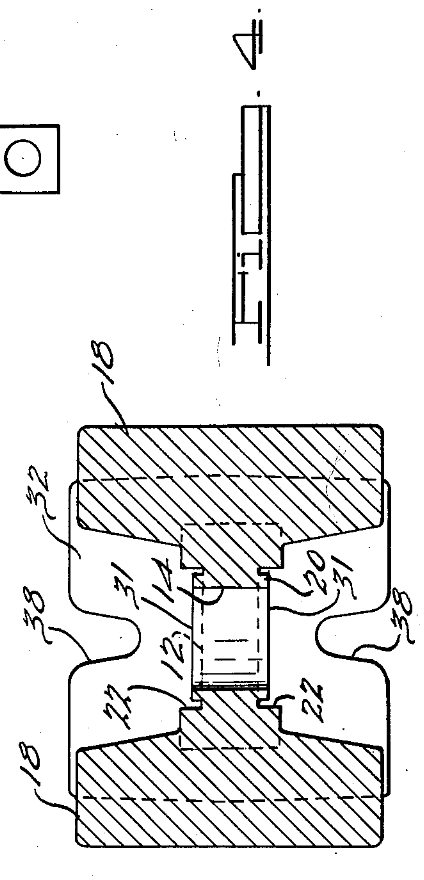
INVENTORS.
Michael A. Koltuniak,
Thomas N. Urquhart,
Edward J. Sopcak,
BY
Harness, Dickey & Pierce
ATTORNEYS.

United States Patent Office 3,171,069
Patented Feb. 23, 1965

3,171,069

DIODE HEAT SINK STRUCTURE

Michael A. Koltuniak, Macomb County, Thomas N. Urquhart, Oakland County, and Edward J. Sopcak, Livingston County, Mich., assignors to The Udylite Corporation, Detroit, Mich., a corporation of Delaware
Filed Oct. 12, 1961, Ser. No. 144,625
4 Claims. (Cl. 317—234)

The present invention broadly relates to a heat transfer apparatus and more particularly to an integrally cast air-cooled diode heat sink structure having excellent electrical and heat conductivity characteristics and a high capacity of heat dissipation.

The present invention pertains to a heat exchanging device employed in electrical apparatus for dissipating heat energy generated during the transmission of electrical current. More specifically, the diode heat sink structure of the present invention is applicable to electrical apparatus for rectifying high amperage alternating current to direct current for a variety of purposes, such as for example, for use in electroplating operations and the like. Rectifier apparatus of this type generally employ a plurality of crystal-type diodes which provide high efficiency rectification of alternating current. During rectification, and particularly with currents of high amperage, a considerable amount of heat is generated which must be removed to avoid overheating and permanent damage to the crystal diode structure.

The removal of heat from crystal diodes has heretofore been achieved by either utilizing liquid cooled heat exchanging apparatus employing elaborate pumping and conduit circuits and complex controls to assure a continuous supply of cooling liquid for removing the heat generated, or air-cooled type heat exchanging apparatus on which the crystal diodes are mounted and which are disposed in a high velocity air stream to dissipate the heat evolved during rectification.

In the air-cooled type heat exchanging apparatus heretofore known, the large surface areas required to achieve adequate heat dissipation by convection and radiation are obtained by attaching a plurality of plates or fins to an electrical conductor base on which the crystal diodes are mounted. This structure has the inherent disadvantage that the junctures between the conductor base and fins form heat barriers retarding the conduction of heat from the conductor base to the fins attached thereto. In view of this, the air-cooled heat sinks heretofore known are costly to manufacture and are cumbersome, due to their excessive size and weight in order to assure adequate heat dissipation characteristics. Moreover, the tendency of an oxide film to form on the surfaces of the fins and conductor base adjacent to their connecting surfaces during use has a tendency to further increase the thermal barrier therebetween decreasing their heat dissipation efficiency.

It is accordingly, a primary object of the present invention to provide an air-cooled diode heat sink structure which overcomes the problems present in air-cooled diode heat sinks heretofore known.

Another object of the present invention is to provide an air-cooled diode heat sink structure which comprises an integrally cast metallic structure having high heat conductivity and electrical conductivity characteristics throughout and which is devoid of the thermal conductivity barriers at the connections between the fins and the conductor base.

A further object of the present invention is to provide an integrally cast diode heat sink structure which is of compact and simple design, of efficient and cooler operation, and of economical manufacture.

Other objects and advantages of the present invention will become apparent from the following detailed description taken in conjunction with the accompanying drawings, wherein:

FIG. 4 is a transverse vertical sectional view through the diode heat sink shown in FIGURE 3 and taken along the line 4—4 thereof; and FIG. 5 is a side elevation view partly in section of a diode heat sink structure incorporating thereon a plurality of crystal type diodes.

Figure 1:
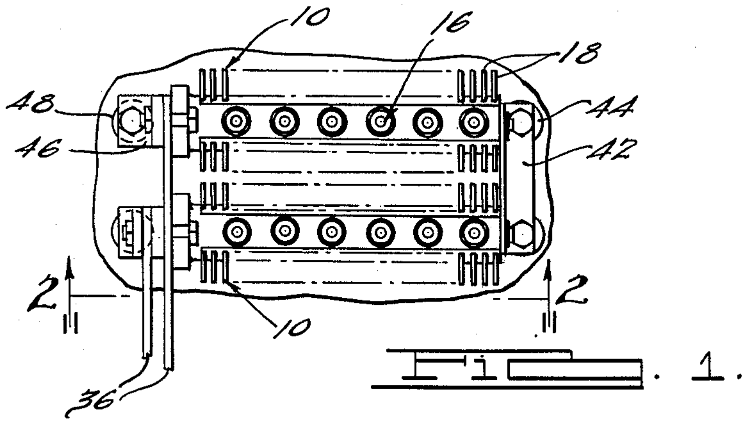
FIGURE 1 is a fragmentary plan view of a rectifier assembly incorporating therein two diode heat sink structures constructed in accordance with the preferred embodiments of this invention.

Referring now to the drawings, an exemplary diode heat sink 10 constructed in accordance with the preferred embodiment of the present invention, comprises an integrally cast structure including an elongated longitudinal web 12 having a plurality of bores 14 therethrough for securely mounting a plurality of crystal-type diodes 16 in intimate electrical and heat conducting contact thereon. The exemplary heat sink 10 shown is provided with six bores 14 for removably mounting six diodes. It will be understood that the number of bores 14 provided can be varied to accommodate a greater or lesser number of crystal diodes depending on the total output current required and the current capacity of each diode used. A plurality of transverse fins 18 are integrally affixed to the web 12 and extend in substantially spaced parallel relationship along each of the longitudinal side edges thereof. The inward projecting edges of the fins 18 along each of the side edges of the web 12 are positioned relative to each other a distance sufficient so as to provide easy access to the diodes 16 enabling simple installation and replacement thereof.

The web 12 is preferably provided with a raised boss 20 around each of the bores 14 against which the diode 16 is firmly seated. The web 12 is preferably of an I-shaped cross-section formed by a pair of longitudinal slots extending the length of the web whereby the edges 22 produced thereby are adapted to coact with one surface of a hexagonal body portion 24 of the diode 16 to prevent relative rotation thereof in the bore and inadvertent disengagement therefrom.

The specific details of the crystal diode 16 are not necessary to an understanding of the structure of the diode heat sink comprising the present invention and accordingly will not be described in detail. Diodes of this general type are well known in the art and include crystals of silicon or germanium, for example, which are effective to transmit current in one direction providing therewith a means of rectifying alternating currents. As can be best seen in FIG. 5, the crystal diode 16 includes a threaded shank 26 extending axially from the hexagonal body portion 24 on which a clamping nut 28 is threadably engaged for securely mounting the diode on the web 12. The clamping nut 28 is of a size smaller than the width of the longitudinal slots whereby the edges 22 do not coact with the clamping nut so that it can be tightened to the requisite torque. A suitable conductor 30 is electrically connected to the diode 16 for transmitting alternating current thereto which is restified and conducted from the diode through the web 12 to a takeoff conductor connected thereto.

In order to achieve satisfactory electrical and heat conduction from the diodes 16 to the heat sink 10 on which they are mounted, it is critical that the face surfaces 31 of the raised bosses 20 are provided with a smooth and regular surface finish of less than about 125 microinches, and preferably less than about 75 microinches. It is also important that the faces 31 of the raised bosses 20 around each bore 14 are disposed in substantially parallel relationship to each other to assure good seating of the diodes 16. Parallelism between the opposing faces 31 within about .001 inch has been found to provide satisfactory diode seating characteristics. By employing surface finishes which are rougher and/or more irregular or wavy than the limits hereinabove set forth and/or a non-parallel relationship between the faces 31 creates a condition wherein only partial surface contact is achieved between the diode and the web of the heat sink 10 causing a heat barrier that inhibits heat conduction from the diode which prevents adequate heat dissipation therefrom. In addition, in many instances a misaligned condition can cause arcing to occur between the diode and heat sink which causes a further evolution of heat resulting in a detrimental degradation and a shortening of the life of the diode and a resultant decrease in the overall efficiency of the rectifier apparatus.

One end of the longitudinal web 12 is provided with a transverse flange 32 integrally united thereto for removably securing the heat sink, such as by means of bolts 34, to a bus bar 36 for conducting the rectified current to a load. The area of the contacting face of the transverse flange 32 is appropriately proportioned for providing low resistance conduction of the rectified current to the bus bar. The transverse flange 32 is provided with a pair of inwardly extending slots 38 which are adapted to receive the shanks of the bolts 34 for securely fastening the heat sink to the bus bar 36. The opposite end portion of the web 12 is provided with a suitable projection such as a lug 40 which is adapted to be slidably positioned in a bore in an upstanding L-shaped supporting bracket 42, which is mounted on an insulator 44.

Figures 2, 3:
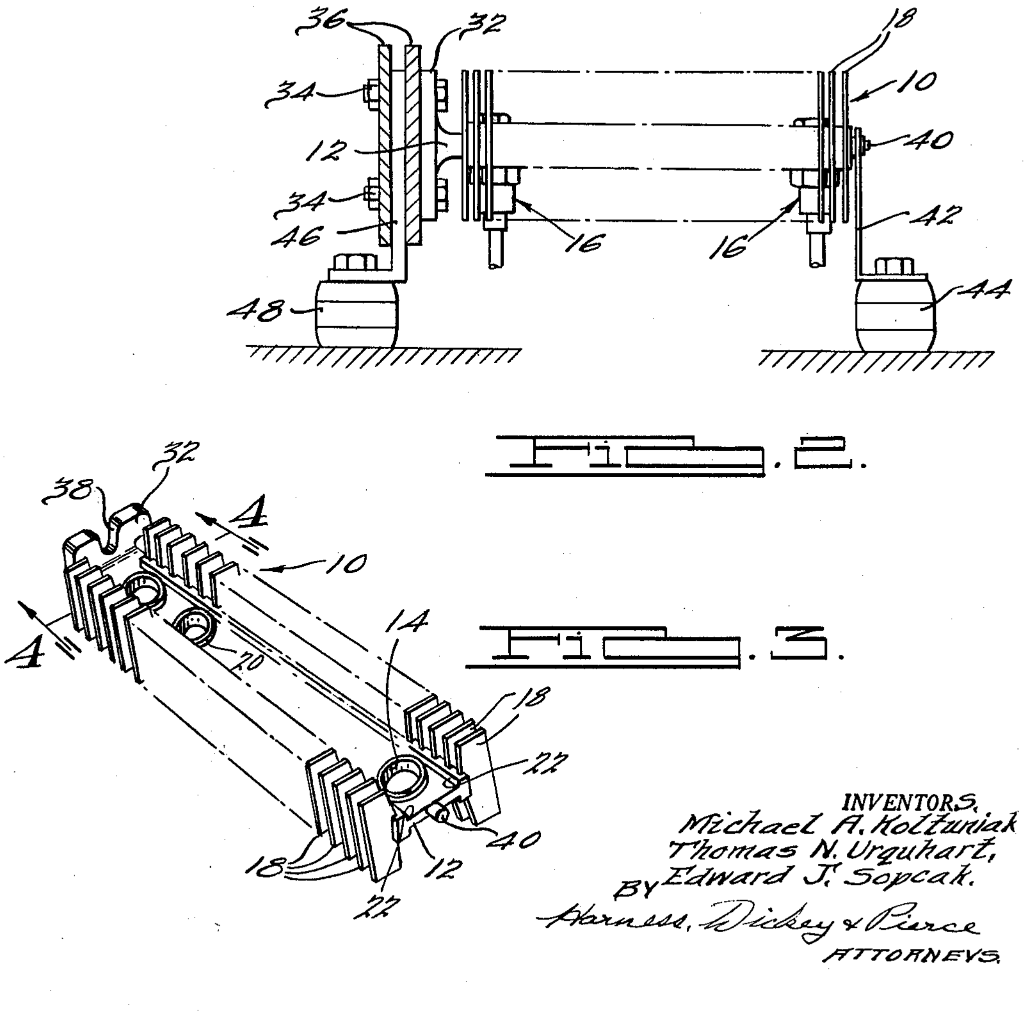
FIG. 2 is a side elevation view partly in section of the rectifier assembly shown in FIGURE 1 as viewed along the line 2—2 thereof.
FIG. 3 is a perspective view of a diode heat sink structure adapted to support six crystal diodes.

The diode heat sink structures may be employed singly or in multiples depending on the current rating of each of the diodes employed and the total output current required. Conventionally, when more than one diode heat sink 10 is required, the heat sinks are mounted in side-by-side relationship as shown in FIGURE 1 having the flanged ends thereof securely bolted in electrical contact with the bus bars 36 which may be conveniently supported by an upstanding L-shaped bracket 46 mounted on an insulator 48 as shown in FIGURES 1 and 2. The opposite ends of the heat sinks 10 are supported by the bracket 42 which is positioned in engaging relationship with the lug 40 projecting from the web 12.

During the rectification of high amperage alternating current, increased heat dissipation can be achieved by passing a relatively high velocity air stream over the fins 18 increasing the dissipation of heat therefrom by convection. The integral cast structure of the heat sinks 10 provide an additional advantage in that the surfaces thereof are preferably slightly irregular by virtue of the surface irregularities in the surface of a sand or shell mold in which the heat sink is cast. These slight surface irregularities further enhance the heat dissipating characteristics thereof by increasing the total surface area and additionally create turbulence in the air stream as it passes between and over the fins 18 and the longitudinal web 12. Increased heat dissipation can also be achieved by increasing the radiation properties of the heat sink by providing the surfaces thereof with a thin darkened heat conductive coating such as a black carbonized coating, for example, and preferably a calcium polysulfide coating.

It will be appreciated from the foregoing that the metal employed for making the heat sink must possess both excellent thermal conductivity characterstics as well as excellent electrical conductivity characteristics. It is for this reason that heat sinks made essentially of copper or alloys of copper such as brass and bronze consisting predominantly of copper constitute the preferred materials.

While it will be apparent that the embodiments of the invention herein disclosed are well calculated to fulfill the objects of the invention, it will be appreciated that the invention is susceptible to modification, variation and change without departing from the proper scope or fair meaning of the subjoined claims.

What is claimed is:

1. An air-cooled diode heat sink for dissipating heat evolved during the rectification of alternating electric current by a plurality of crystal diodes, said heat sink comprising an integrally cast metallic structure of high electrical and heat conduction properties including an elongated longitudinal web having a plurality of bores therethrough disposed in spaced intervals along said web, a plurality of crystal diodes removably mounted in said bores and disposed in intimate electrical and heat-conducting contact with said web, the surfaces of said web adjacent to said bores against which said diodes are seated provided with a surface finish of less than about 125 microinches, a plurality of transverse fins integrally attached to the longitudinal side edges of said web and disposed in spaced substantially parallel relationship, mounting means on one end of said web for mounting and electrically connecting said heat sink to a bus bar, and means at the other end portion of said web for engaging an insulated supporting member.

2. An air-cooled diode heat sink for dissipating heat evolved during the rectification of alternating electric current by a plurality of crystal diodes, said heat sink comprising an integrally cast metallic structure of high electrical and heat conduction properties including an elongated longitudinal web having a plurality of bores therethrough disposed in spaced intervals along said web for removably mounting a plurality of crystal diodes disposed in intimate electrical and heat-conducting contact therewith, the surfaces of said web adjacent to said bores against which said diodes are seated provided with a surface finish of less than about 125 microinches, the opposite said surfaces around each of said bores disposed within .001 inch parallelism to the other, a plurality of transverse fins integrally attached to the longitudinal side edges of said web and disposed in spaced substantially parallel relationship, a flange integrally affixed to and projecting transversely of one end of said web for removably securing said heat sink in electrical contact to a bus bar, and engaging means at the other end portion of said web adapted to engage an insulated supporting member.

3. An air-cooled diode heat sink for dissipating heat evolved during the rectification of alternating electric current by a plurality of crystal rectifying cells, said heat sink comprising an integral metallic structure of a metal possessing high electrical and heat conduction properties selected from the group consisting of copper, brass, bronze, and mixtures thereof and including an elongated longitudinal web having a plurality of bores therethrough disposed in spaced intervals along said web, a plurality of crystal rectifying cells removably mounted in said bores and disposed in intimate electrical and heat-conducting contact with said web, the surfaces of said web adjacent to said bores against which the crystal rectifying cells are seated provided with a surface finish of less than about 125 microinches, a plurality of fins integrally attached to at least one of the longitudinal side edges of said web and disposed in spaced substantially parallel relationship, and mounting means integrally formed on one end portion of said web for mounting and electrically connecting said heat sink to an electrical conductor.

4. A heat sink as described in claim 3 further characterized in that the surfaces of said heat sink are provided with a dark heat conductive surface coating to increase the radiation characteristics thereof.

References Cited in the file of this patent

UNITED STATES PATENTS

| | | |
|---|---|---|
| 1,731,203 | Rabezzana et al. | Oct. 8, 1929 |
| 2,045,659 | Lindenblad | June 30, 1936 |
| 2,167,378 | Shoemaker et al. | July 25, 1939 |